United States Patent
Lee et al.

(10) Patent No.: US 6,355,547 B1
(45) Date of Patent: Mar. 12, 2002

(54) METHOD OF FORMING A SELF-ALIGNED CONTACT PAD FOR A SEMICONDUCTOR DEVICE

(75) Inventors: Jae-Goo Lee, Seoul; Chang-Hyun Cho, Koyang; Gwan-Hyeob Koh, Seocho-gu, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/645,968

(22) Filed: Aug. 24, 2000

(30) Foreign Application Priority Data

Aug. 24, 1999 (KR) .......................... 99-35211

(51) Int. Cl.$^7$ ............... H01L 2/3209; H01L 21/4763; H01L 21/44; H01L 21/8238; H01L 21/336

(52) U.S. Cl. ................ 438/586; 438/233; 438/299; 438/597

(58) Field of Search ................ 438/597, 624, 438/229, 233, 197, 299, 587, 588, 591, 790, 586

(56) References Cited

U.S. PATENT DOCUMENTS

| 4,728,632 A | * | 3/1988 | Lu et al. ........................ 437/52 |
| 4,992,848 A |   | 2/1991 | Chin et al. ..................... 36/357 |
| 4,997,790 A | * | 3/1991 | Woo et al. ..................... 437/195 |
| 5,385,634 A | * | 1/1995 | Butler et al. ................... 156/644 |
| 5,683,922 A | * | 11/1997 | Jeng et al. ..................... 437/41 |
| 6,072,241 A | * | 6/2000 | Kojima ......................... 257/752 |
| 6,074,959 A | * | 6/2000 | Wang et al. ................... 438/738 |
| 6,091,154 A | * | 7/2000 | Ohkawa ........................ 257/774 |
| 6,165,880 A | * | 12/2000 | Yaung et al. ................... 438/592 |
| 6,177,320 B1 | * | 1/2001 | Cho et al. ..................... 438/279 |
| 6,245,669 B1 | * | 6/2001 | Fu et al. ....................... 438/636 |

OTHER PUBLICATIONS

Y. Kohyama et al., "A Fully Printable, Self–Aligned and Planarized Stacked Capacitor DRAM Cell Technology for 1Gbit DRAM and Beyond", 1997 Symposium on VLSI Technology Digest of Technical Papers, pp. 17–18.

* cited by examiner

Primary Examiner—Richard Elms
Assistant Examiner—Adam Pyonin
(74) Attorney, Agent, or Firm—Marger Johnson & McCollom, P.C.

(57) ABSTRACT

A method of manufacturing a self-aligned contact pad for the fabrication of an integrated circuit is disclosed. A plurality of gate structures is formed on the substrate. A first insulating layer is formed over the plurality of gate structures. Then, a second insulating layer is formed over the first insulating layer and filling spaces between the gate structures. Next, a portion of second insulating layer is removed between the gate structures, thereby forming a plurality of contact holes between the gate structures and exposing a portion of the first insulating layer. The exposed portion of the first insulating layer is etched away to form a gate spacer on the sidewalls of the gate structures and exposing surfaces of active regions of the substrate. Finally, the plurality of contact holes are filled with a first conductive layer and the first conductive layer is planarized to form contact pads.

19 Claims, 19 Drawing Sheets

Peri or Core Region

METHOD OF FORMING A SELF-ALIGNED CONTACT PAD FOR A SEMICONDUCTOR DEVICE

CROSS REFERENCE TO RELATED APPLICATIONS

This application claims priority from Korean Patent Application No. 99-35211 filed Aug. 24, 1999 with the Korean Industrial Property Office, which document is hereby incorporated by reference.

FIELD OF THE INVENTION

The present invention relates to a method of manufacturing a semiconductor device. More specifically, the present invention is directed to a method of forming a contact pad for a semiconductor structure with a high aspect ratio in the manufacture of a dynamic random access memory (DRAM).

BACKGROUND OF THE INVENTION

As the chip density of an integrated circuit increases, the minimum feature size shrinks down to a sub-half-micrometer regime. Accordingly, the margin of the lithographic alignment as well as the size of a contact that interconnects a conductive layer on the wafer has been reduced.

A self-aligned contact (SAC) technology has been proposed to solve the problems of the reduced alignment margin. U.S. Pat. No. 4,992,848 discloses a SAC technology that alleviates the burden of making a fine contact hole for a DRAM.

FIGS. 1A to 1E are schematic, cross-sectional views illustrating various manufacturing steps for implementing a traditional SAC pad. Referring to FIG. 1A, stacked gate structures each comprising a gate oxide 103, a doped polysilicon layer 104, a tungsten silicide 105, and gate capping layers 106 and 107 are formed on the wafer with an active region 101 and a device isolation region 102.

According to the prior art, the gate capping layers 106 and 107 are chosen to have an etch selectivity against an interlayer dielectric film to be formed in the subsequent processing step. Gate spacers 108 are formed on the sidewalls of the stacked gate structures using a material having an etch selectivity with respect to the interlayer dielectric film.

Referring to FIG. 1B, a first interlayer dielectric film is formed and then planarized by a chemical mechanical polishing (CMP) step to form a planarized dielectric film 110. Thereafter, the prior art, as depicted in FIG. 1C, introduces an opening window 111 for a contact hole through lithography and the subsequent etching process.

Referring to FIGS. 1D and 1E, the SAC pads 113, 114, and 115 are completed by etching the conducting polysilicon layer 112 through the etch-back or the CMP process. However, as the chip density reaches the gigabit scale, shorts between the gate 104, 105 and the contact pads 113, 114, and 115 could occur due to the reduced alignment margin in high-density DRAMs.

Furthermore, the horizontal dimension to be defined during the etching process is scaled down to a 0.1 μm regime while the vertical depth of the contact structure stays approximately in micrometer scale.

Accordingly, it is not easy to diffuse reactive gases into deep contact holes with a reduced diameter during a reactive ion etching (RIE) process to form SAC contacts. In addition, the drainage of the by-products during the RIE process is also difficult task for the fabrication of the deep-sub-half-micrometer devices.

As a result, an etching speed slows down during the RIE process for the formation of contact holes and the RIE process sometimes fails to complete the formation of contact holes due to the pile-up of the etch-stop products therein.

The RIE process is controlled in such a way that the etch-stop products, i.e. polymers, are minimized during the etching process. Further, the RIE etching time can also be prolonged. However, those schemes can result in shorts between the SAC pads 113, 114, and 115 and the gates 104 and 105 due to unwanted etching of the gate spacer 108 and the gate capping layers 106 and 107.

In order to solve the above-mentioned problems, Y. Kohyama et. al proposed a new structure combining the bit line contact and the storage node in their paper entitled with, A fully printable, self-aligned, and planarized stacked capacitor DRAM cell technology for 1Gbit DRAM and beyond, pp.17–18, Technical Digest of Symposium on VLSI Technology, 1997.

The prior art of Y. Kohyama et. al, however, has a drawback of having a poor etch selectivity between the interlayer dielectric film 110 and the gate insulating layer or spacer 108 because the generation of the polymer is insufficient due to the relatively small surface area covered with the photoresist film.

It should be noted that the major path for a precursor, which contributes to the generation of the polymer, is both the injected gas and the photoresist film. Therefore, the amount of the supplied precursor is determined by the ratio of the surface area covered with the photoresist film.

Additionally, the prior art, as depicted in FIGS. 1A to 1E, can not implement a gate spacer with a flat surface profile because the inner side of the tungsten silicide layer 105 on the polysilicon gate 104 is consumed.

As a result, voids can be created while the interlayer dielectric film is deposited for the formation of the SAC contact in accordance with the prior art.

Furthermore, leakage currents can flow if the device isolation region 102 is chemically attacked during wet etching. This is due to the loss of the silicon nitride layer that is supposed to function as an etch-stopper during the etching step of the interlayer dielectric film 110.

In other words, the traditional methods for manufacturing SAC pads, as depicted in FIG. 2, has a problem in that the upper region 120 of a shallow trench isolation (STI) is vulnerable to a chemical attack during the wet etching. For instance, approximately 300 Å of the STI region can be consumed during the wet etching for the expansion of the SAC pad of the STI is 2500 Å.

Furthermore, referring to FIG. 3, SAC contact pads (not shown) can be electrically shorted to the gate stack 104 and 105 through a path 155 due to the loss of the active region 150. This is because the etch-stopping silicon nitride layers, such as the gate capping layer 106 and the gate spacer 108, can be lost during the wet-dipping process, following SAC contact holes forming step, to expand the SAC pad area.

Therefore, a need arises in the art for a method to manufacture SAC pads that are not subject to these limitations of the prior art.

SUMMARY OF THE INVENTION

Accordingly, the present invention provides a method of manufacturing SAC pads, which prevents shorts from occurring between gate structures and the SAC pads due to unwanted etching of gate spacers or of a gate-capping layer.

The present invention additionally provides a method of manufacturing SAC pads, which increases the alignment margin during lithography even for contact structures with a reduced dimension.

The present invention provides a method of manufacturing SAC pads, which makes it easy to separate the SAC pads during the etching process step.

Further, the present invention provides a method of manufacturing SAC pads, which prevents the generation of leakage currents in the device isolation region due to unwanted etching of the etch-stopping layer during etching of the interlayer dielectric film.

As a result, it becomes possible to form SAC contact pads without causing shorts and leakage problems of the prior art.

In accordance with the present invention, there is provided a method of manufacturing SAC pads. Firstly, a first insulating layer is formed over gate structures. Thereafter, a second insulating layer is formed on the first insulating layer and the second insulating layer sufficiently fills the spaces between the gate structures. Then contact holes are formed by etching the second insulating layer between the gate structures. Subsequently, a gate spacer is formed on the sidewalls of the gate structures by etching the first insulating layer and exposing the active region on the wafer. A first conductive layer is then deposited to completely fill the contact holes. Finally, the first conductive layer is separated through a step of etching the first conductive layer until the first insulating layer is exposed.

BRIEF DESCRIPTION OF THE DRAWINGS

The above objects and advantages of the present invention will become more apparent by describing in detail in a preferred embodiment thereof with reference to the attached drawings in which.

DETAILED DESCRIPTION OF THE PREFERRED EMBODIMENT OF THE INVENTION

The present invention will be explained in detail with reference to the accompanying drawings.

Figure 1A:
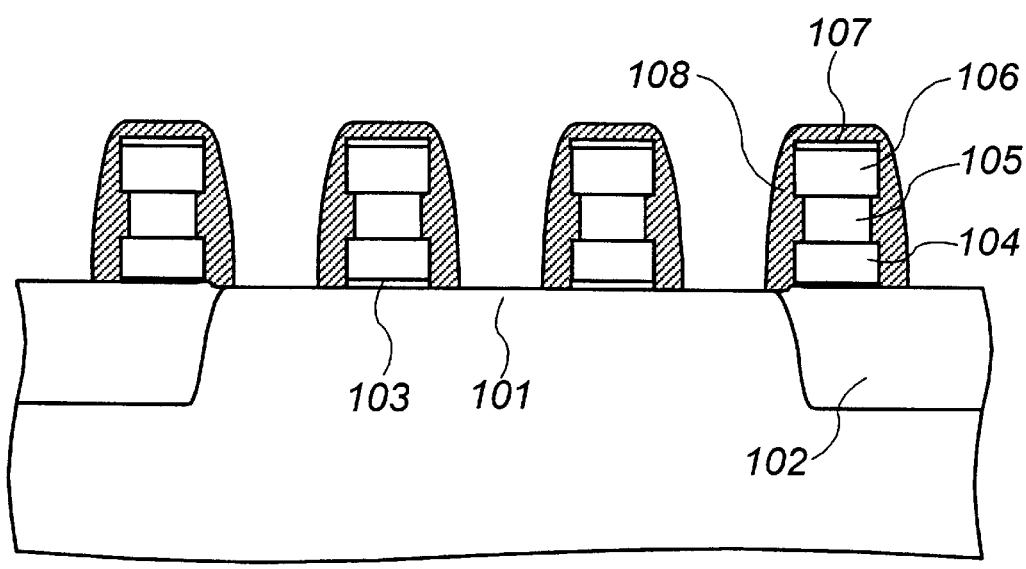
FIGS. 1A to 1E are schematic, cross-sectional views illustrating the various stages of manufacturing an SAC pad in accordance with the prior art.
Figure 1B:
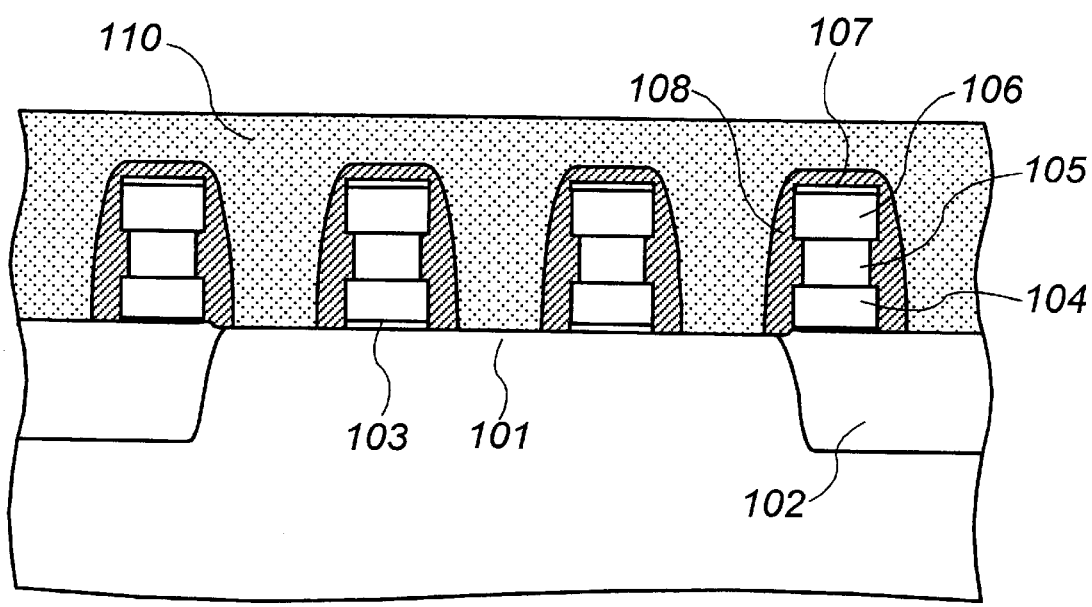
Figure 1C:
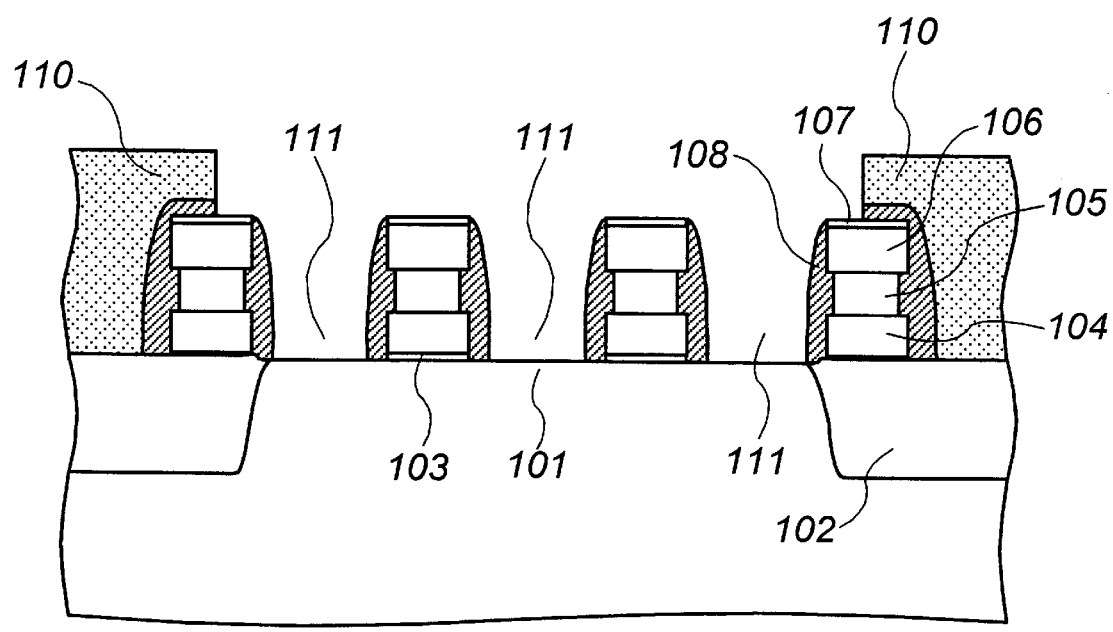
Figure 1D:
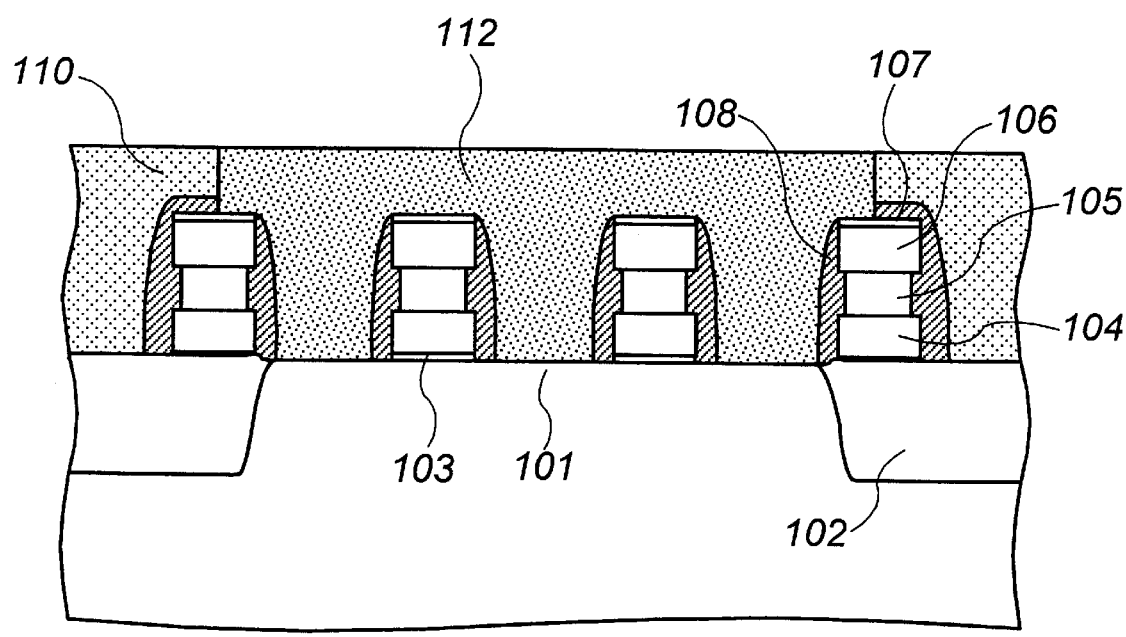
Figure 1E:
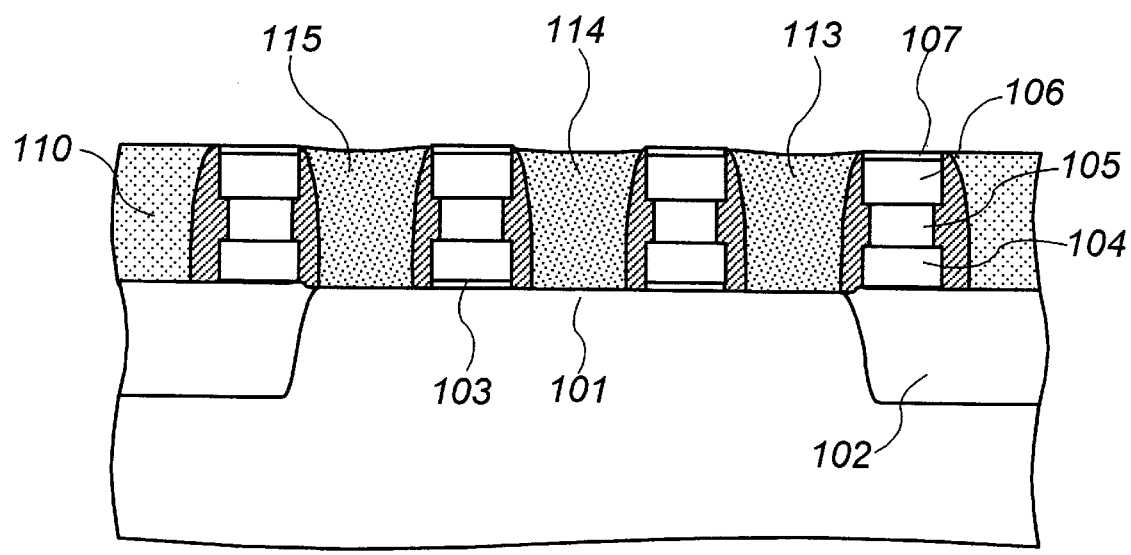
Figure 2:
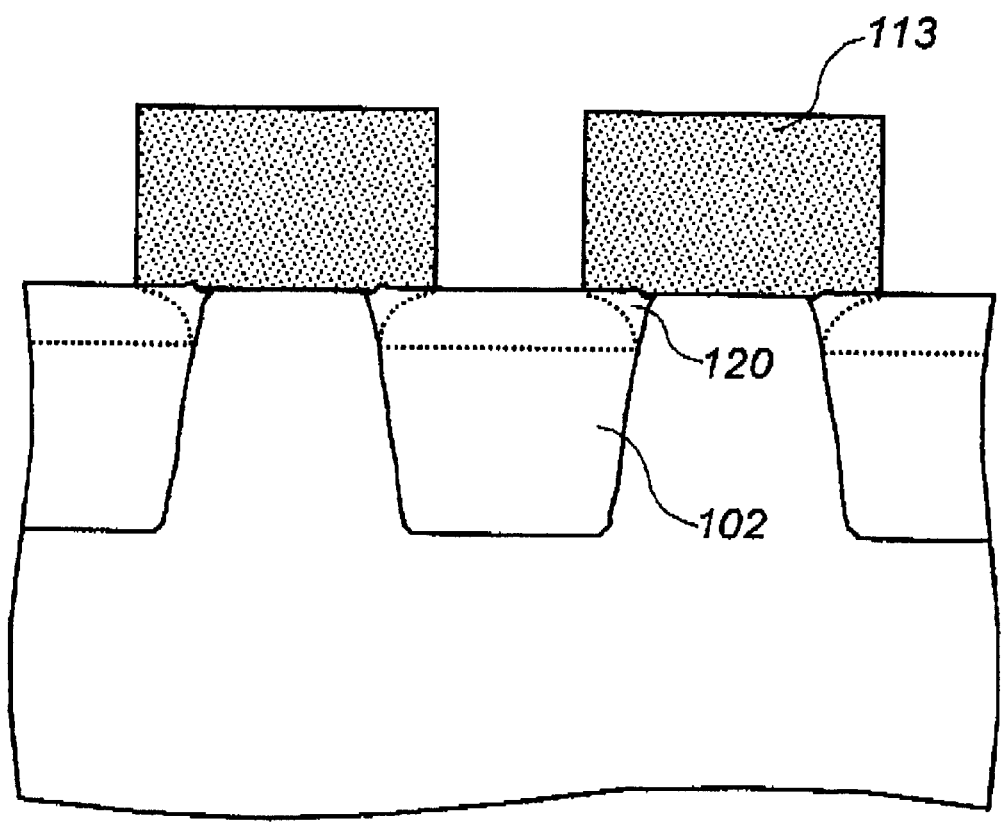
FIG. 2 is a schematic, cross-sectional view illustrating the leakage current problem due to the loss of the device isolation region in accordance with the prior art.
Figure 3:
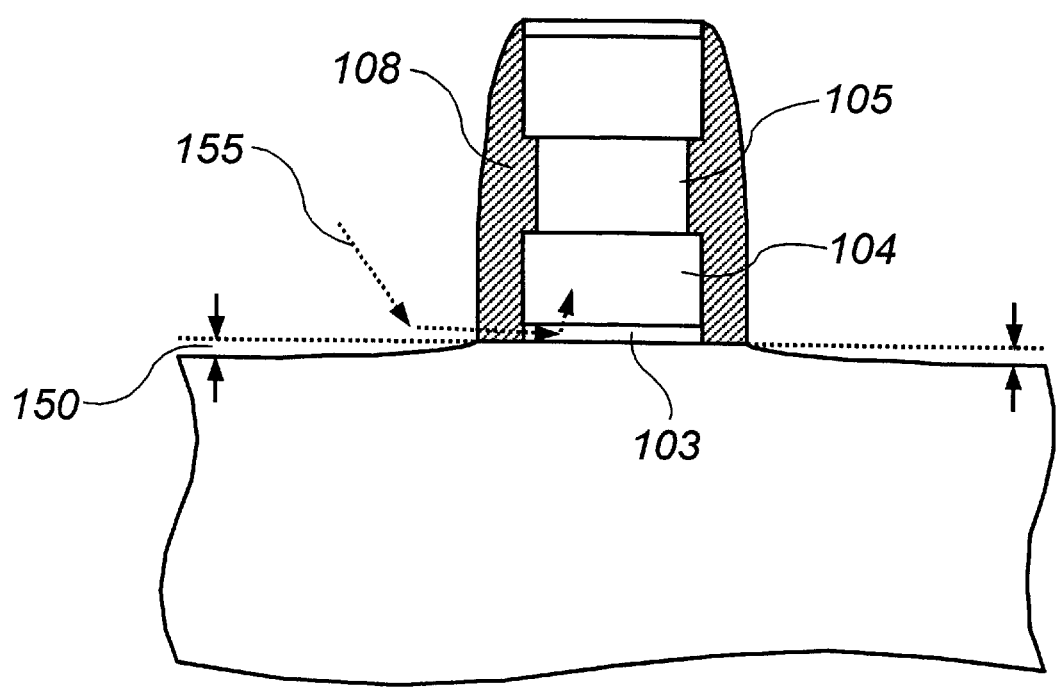
FIG. 3 is a schematic, cross-sectional view illustrating the gate shortage during the SAC etch step in accordance with the prior art.
Figure 4A:
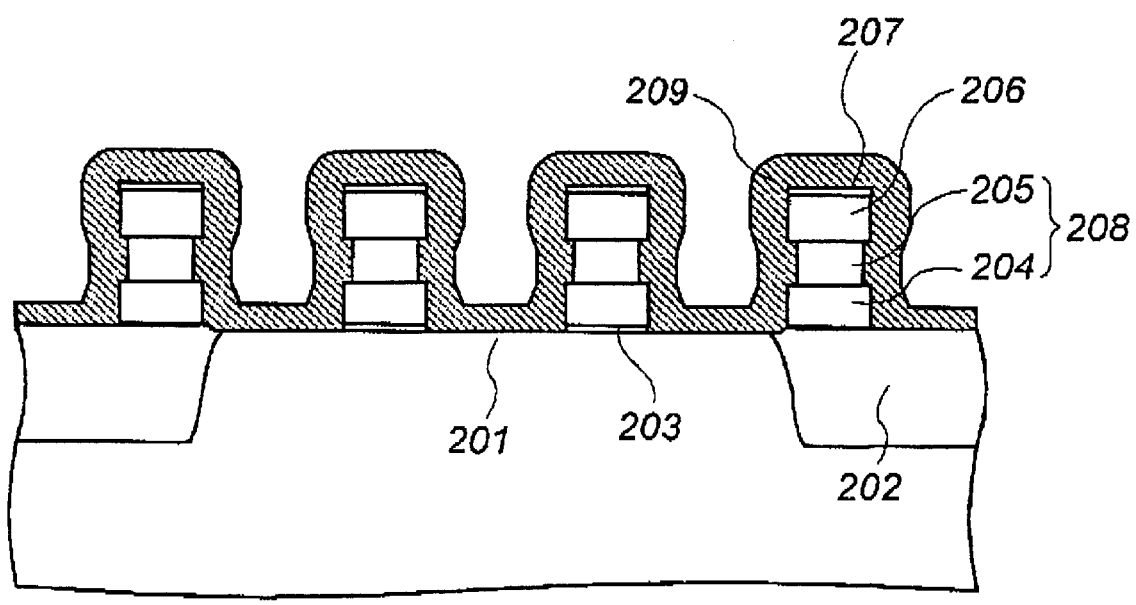
FIGS. 4 to 11 are schematic, cross-sectional views illustrating the various steps of an SAC pad in accordance with the preferred embodiment of the present invention.

FIG. 4A is a schematic, cross-sectional view illustrating gate structures after depositing a dielectric film for forming gate spacers. Referring to FIG. 4A, an active region 201, a device isolation region 202, and a gate oxide layer 203 are illustrated.

As a preferred embodiment for the device isolation region 202, a LOCOS (local oxidation of silicon) or the STI (shallow trench isolation) can be employed. Referring to FIG. 4A again, insulating layers 206, 207, as a capping layer for insulating a gate, are formed on a gate stack 208.

Preferably, the gate stack layer 208 can be a double layer of a polysilicon layer 204 with a thickness of 1000 Å, and a tungsten silicide layer 205 with a thickness of 1000 Å on the gate oxide layer 203 with a thickness of 50~100 Å.

Preferably, for insulating layers 206, 207, a stacked layer of a silicon nitride layer 206 with a thickness of 1000~2000 Å and a silicon oxide layer 207 with a thickness of 300~1000 Å can be employed.

A source/drain ion implantation is performed after the gate structures are patterned. Referring to FIG. 4A again, a first insulating layer 209 is deposited on the gate structures 204, 205, 206, and 207. As a preferred embodiment for the first insulating layer 209, a silicon nitride layer with a thickness of 300~1000 Å can be employed.

The first insulating layer 209 forms a gate spacer in subsequent processing steps and has an etch selectivity against an interlayer dielectric film to be formed.

The surface profile of the first insulating layer 209 also often has an undercut due to the undercut profile of the tungsten silicide layer 205 formed during the previous cleaning steps. The undercut profile of the first insulating layer 209 can form a void during subsequent deposition of the interlayer dielectric film.

Figure 4B:
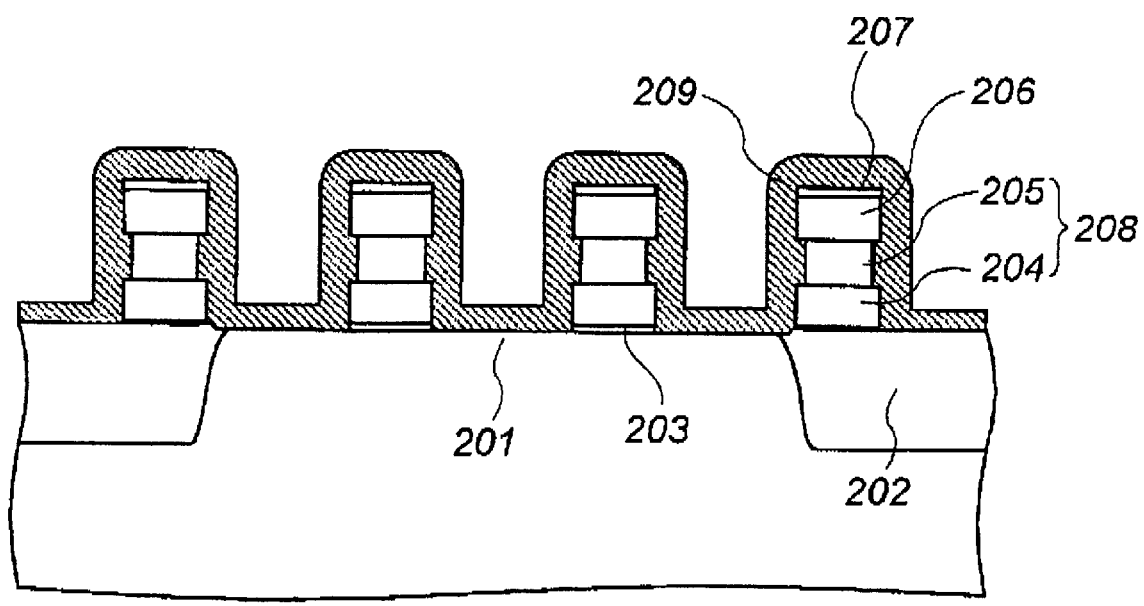

In order to solve the problem of the undercut profile, the present invention, as depicted in FIG. 4B, etches a portion of the first insulating layer 209. In other words, the surface profile of the first insulating layer 209 is controlled to be flat even on the vertical sidewalls of the gate spacer.

As a preferred embodiment of the present invention, two thirds of the thickness of the first insulating layer 209 can be kept during the step of flattening etching process of the first insulating layer in order to obtain a undercut-free surface profile especially on the sidewalls adjacent to the tungsten silicide layer 205.

In this case, if the tungsten silicide layer 205 on the polysilicon layer 204 does not form an undercut during cleaning, the above-mentioned partial etching process step of the first insulating layer may not be required.

Figure 5A:
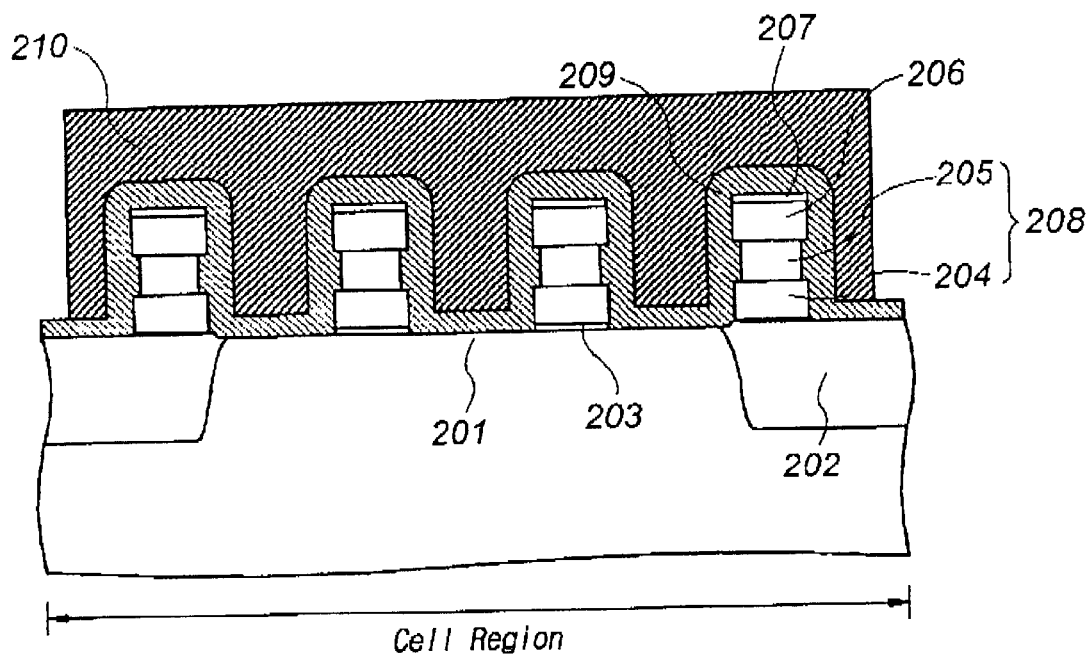
Figure 5B:
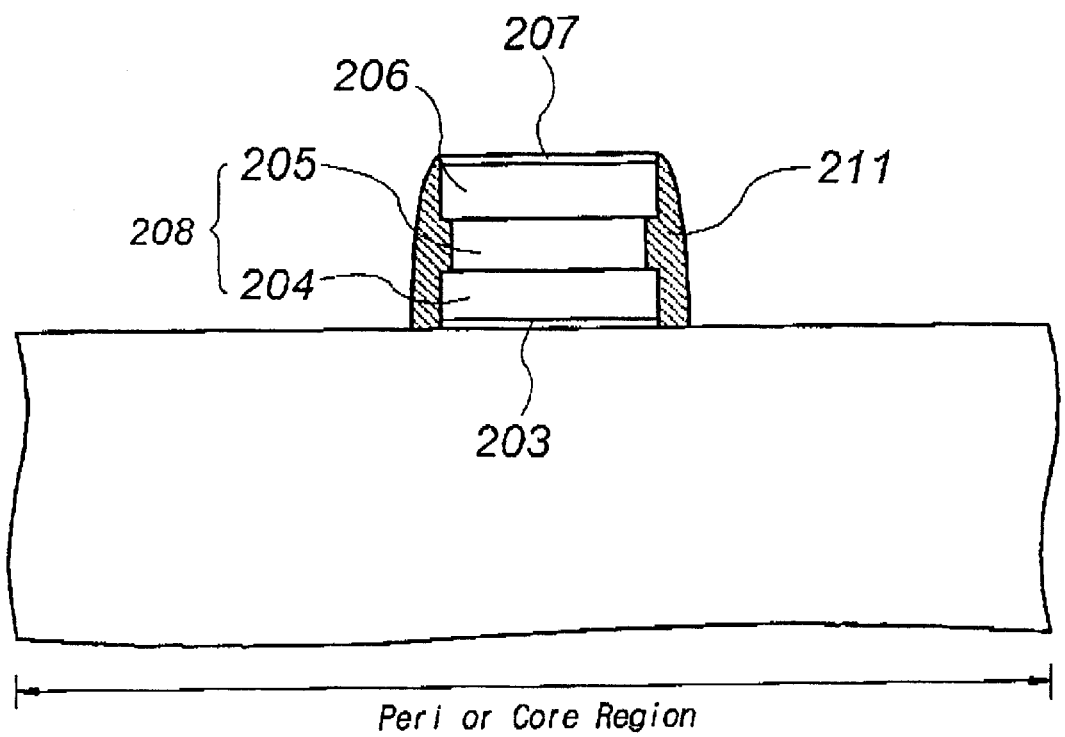

FIGS. 5A to 5B are schematic, cross-sectional views illustrating the steps of manufacturing lightly-doped drains only in the peripheral regions. Referring to FIG. 5A, a photoresist layer 210 is deposited on the gate structures in the cell region.

Referring to FIG. 5B, a gate spacer 211 is formed by anisotropically etching the first insulating layer 209 in the peripheral or logic regions of the wafer. As a preferred embodiment of the present invention, the anisotropic etching can be conducted through an etch-back process.

Thereafter, a heavily doped source/drain ion implantation for the LDD can be performed while the surface of the cell region is covered with the photoresist layer 210.

As preferred embodiment in accordance with the present invention, approximately a third of the thickness of the first insulating layer 209 can be etched away to obtain a steep profile without an undercut prior to the anisotropic etching step in case when to the tungsten silicide layer 205 has an excessive undercut.

The present invention can eliminate an additional processing step of forming a stopping layer unlike the prior art where the formation of the stopping layer that has an etch selectivity against the interlayer dielectric film is necessary.

For instance, a silicon nitride layer with a thickness of 50~200 Å has been used as an etch-stopper layer either for buried contacts or for direct contacts in the prior art. Since the present invention can eliminate a processing step for forming an extra etch-stopper layer, the manufacturing method for a SAC pad in a DRAM can be simplified.

Figure 6:
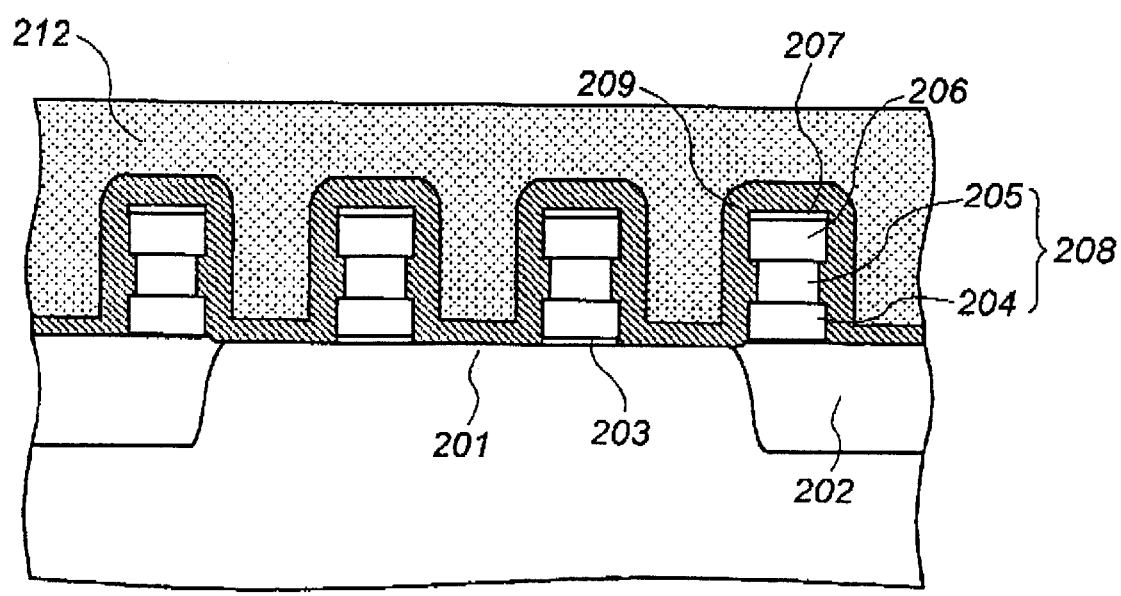

FIG. 6 is a schematic, cross-sectional view illustrating a step of forming a second insulating layer 212 on the wafer. As a preferred embodiment of the present invention, a BPSG (borophosphosilicate glass), USG (undoped silicate glass), or an HDP-CVD (high-density plasma chemical vapor deposition) oxide comprise a second insulating layer 212.

Preferably, the thickness of the second insulating layer 212 is 3500~5500 Å. Because of the possible lateral diffusion of impurities during a high-temperature process, it is desirable to keep the processing temperature low enough to suppress the lateral diffusion especially in high-density DRAMs.

During the HDP-CVD process, the RF power should be increased to fill the narrow space between the gate structures with the second insulating layer 212.

If conventional silicon nitride etch-stopper layer (not shown) is formed, a lift-off of the silicon nitride can occur due to the penetration of the reactive gas into the interface between the silicon nitride layer and the silicon during the HDP-CVD process of the second insulating layer 212.

However, the lift-off problem of the prior art can be solved in accordance with one embodiment of the present invention, in which the first insulating layer 209 (preferably, a silicon nitride layer) is thick enough in the cell region while no first insulating layer 209 is present on the active region in the peripheral region. Therefore, the conventional lift-off problem due to the penetration of the reaction gases in the case of the present invention can be improved.

Referring to FIG. 6 again, the surface of the wafer is planarized through a CMP process to obtain a lithography margin after the deposition of the second insulating layer 212.

As a preferred embodiment in accordance with the present invention, the final thickness of the second insulating layer 212 can be approximately 500~1000 Å during the CMP process. Preferably, an ARC (antireflection coating) layer is formed on the second insulating layer 212 to increase the process margin during lithography.

Figure 7A:
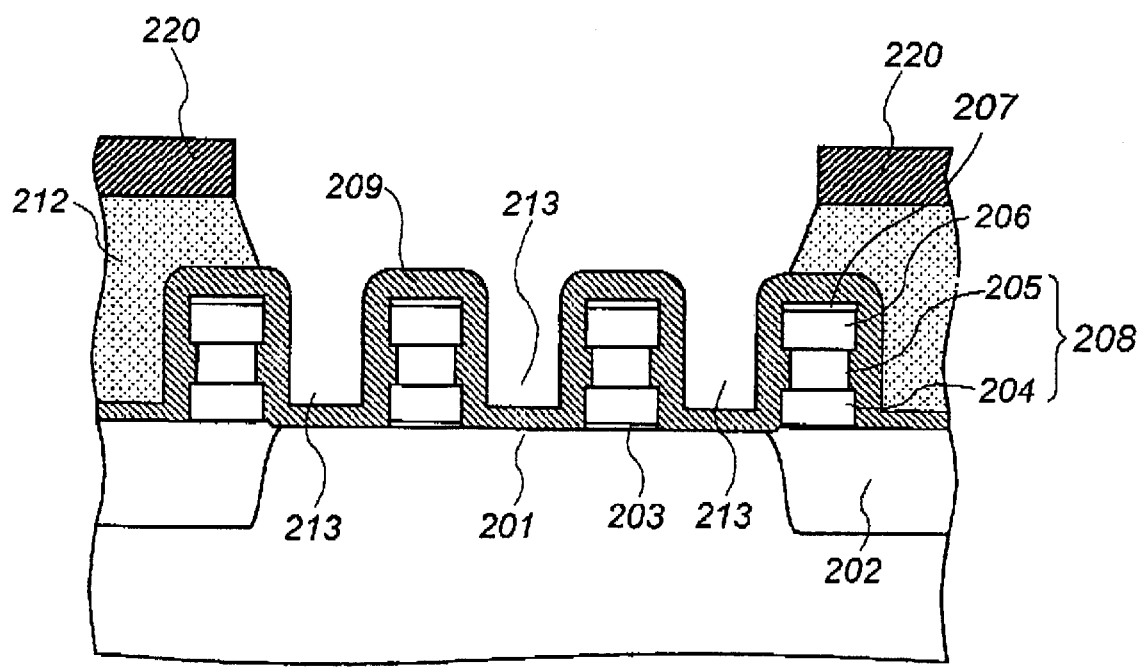
Figure 7B:
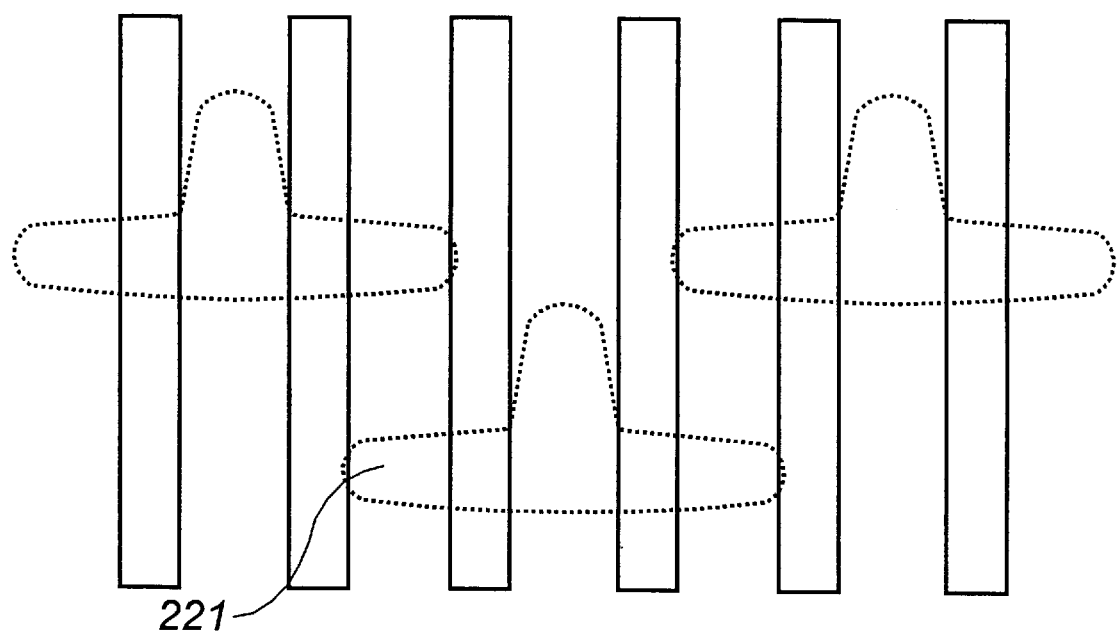

FIG. 7A is a schematic, cross-sectional view illustrating an etch step for forming SAC pads in accordance with the present invention. Referring to FIG. 7A, contact holes 213 for the SAC pads are opened with a photoresist mask layer 220 and the exposed portion of the second insulating layer 212 is removed. Preferably, a T-type pattern 221 can be formed in the layout to define the storage node contact and the bit line contact concurrently, as depicted in FIG. 7B.

Referring to FIG. 7A again, contact holes 213 for the SAC pads are opened through the etching of the second insulating layer 212 using the photoresist mask layer 220. As a preferred embodiment of the present invention, the etching condition can be chosen such that there is an etch selectivity against the silicon nitride layer 209 for the gate spacer.

Preferably, the removal of the first insulating layer 209 should limited during the etching of the silicon oxide layer 212. In other words, the amount of removal of the first insulating layer 209 should be kept negligible during the etching process of the silicon oxide layer 212.

At the beginning stage of the etching process for forming the contact holes, the second insulating layer 212 on the gate structure is removed vertically along with the boundary of the photoresist mask 220.

Once the silicon nitride layer 209 on the gate structure is exposed during the etching process, only the corner portion of the silicon nitride layer is slightly removed due to the etch selectivity. Here, the second insulating layer 212 is etched more than the silicon nitride layer 209. In this case, since the silicon nitride layer 209 on the gate structure has not undergone the gate spacer etching process yet, the surface of the silicon nitride layer 209 is relatively more even than that of the prior art.

As a result, it becomes possible to minimize the loss of the silicon nitride layer 209 both on the corner and on the top of the gate layer structure. Preferably, additional wet etch can be performed to enlarge the size of the SAC pad.

Figure 8A:
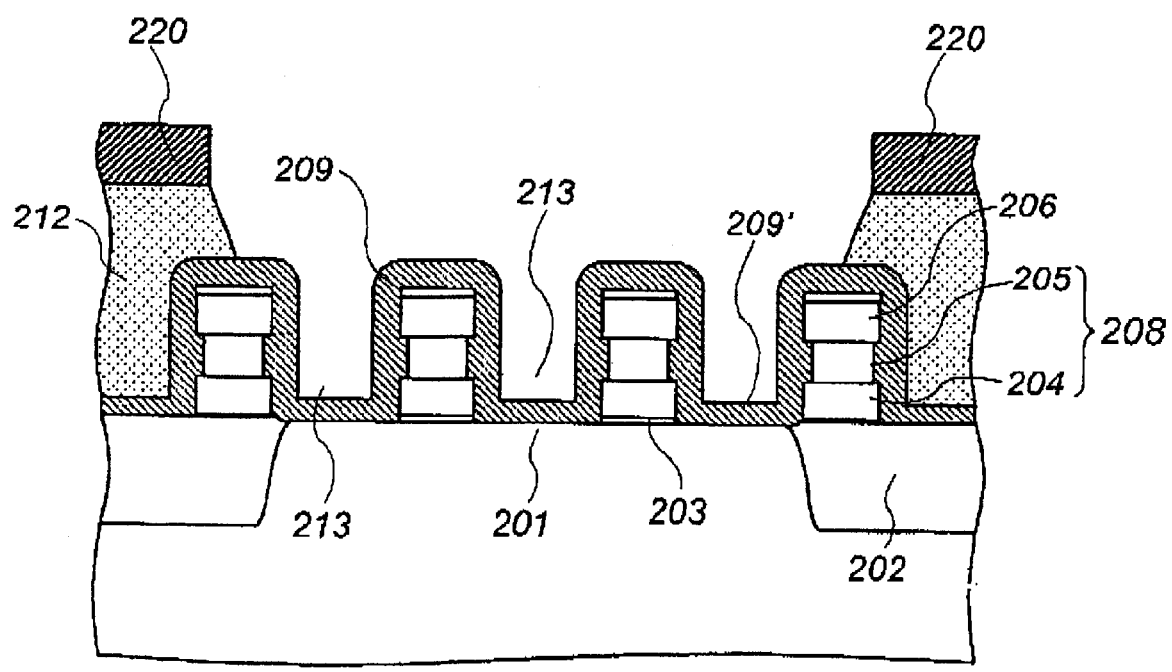

FIG. 8A is a schematic, cross-sectional view illustrating a step of wet etch for enlarging the size of the SAC pad in accordance with the preferred embodiment of the present invention.

Figure 8B:
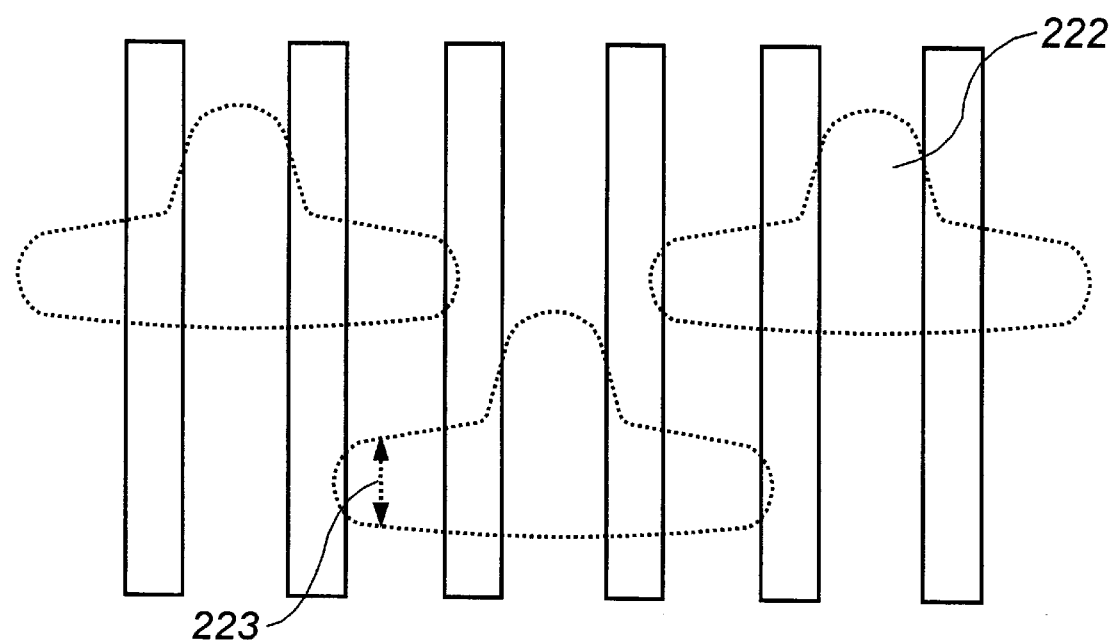

FIG. 8B is a schematic layout illustrating a step of wet etch for enlarging the size of the SAC pad in accordance with the preferred embodiment of the present invention.

Referring to FIG. 8B, the size of the T-type pad 222, 223 is larger than that 221 of FIG. 7B.

Conventionally, leakage currents are often caused by the penetration of the wet etching solution into the device isolation 202. This penetration of the wet etching solution into the device isolation is caused by the loss of the first insulating layer 209.

According to the present invention, however, since at least two thirds of the initial silicon nitride film 209 remains at the bottom 209', it becomes very difficult for wet etching solution to diffuse into the device isolation region 202.

Accordingly, the manufacturing method of the SAC pads in accordance with the present invention makes it possible to increase the alignment margin for the lithography steps of the subsequent bit line contact and the storage node contact by enlarging the SAC pad 223 without deteriorating the device isolation.

Figure 9:
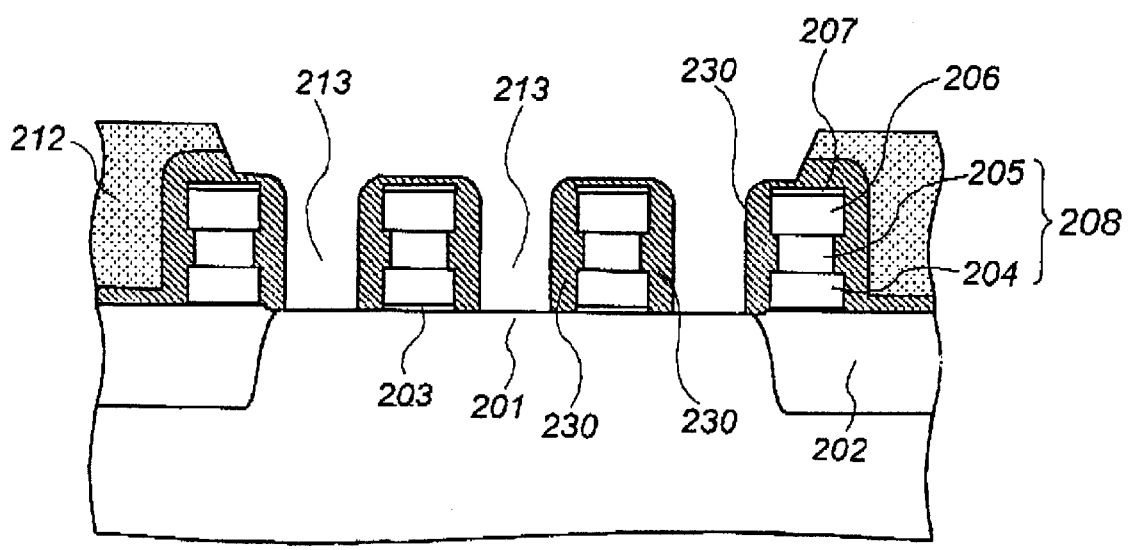

FIG. 9 is a schematic, cross-sectional view illustrating a step of manufacturing a gate spacer in the cell region. Referring to FIG. 9, a gate spacer 230 is formed by anisotropically etching the first insulating layer 209 and 209' for SAC pads.

According to the preferred embodiment of the present invention, the etching time can be reduced because there is no etch-stopper layer unlike the prior art. As a result, it is possible to reduce the loss of the silicon nitride layer on the gate structure.

Furthermore, the anisotropic etching step for the formation of the gate spacer simultaneously eliminates the ARC (antireflection coating) layer. Therefore, generation of defects or the difference in the thickness of the silicon oxide layer can be prevented.

Figure 10:
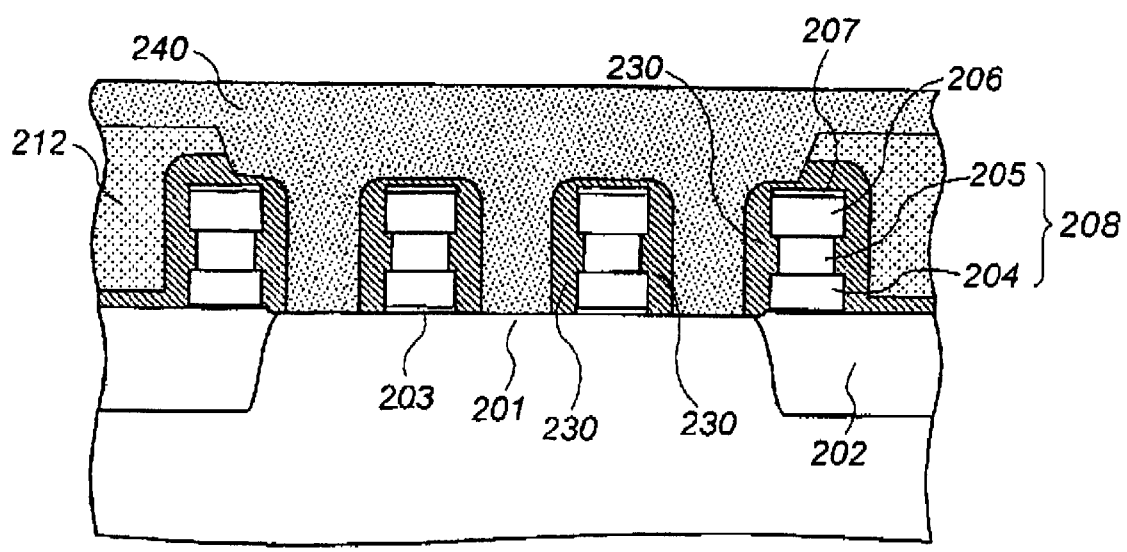

FIG. 10 is a schematic, cross-sectional view illustrating a step of depositing the polysilicon layer on the SAC contact hole in accordance with the present invention.

Referring to FIG. 10, a first conductive layer 240 is deposited on the wafer in such a manner that the contact hole between the gate structures is completely filled with the first conductive layer 240. Preferably, a doped polysilicon film with a thickness of 3500~5000 Å can be employed.

Figure 11:
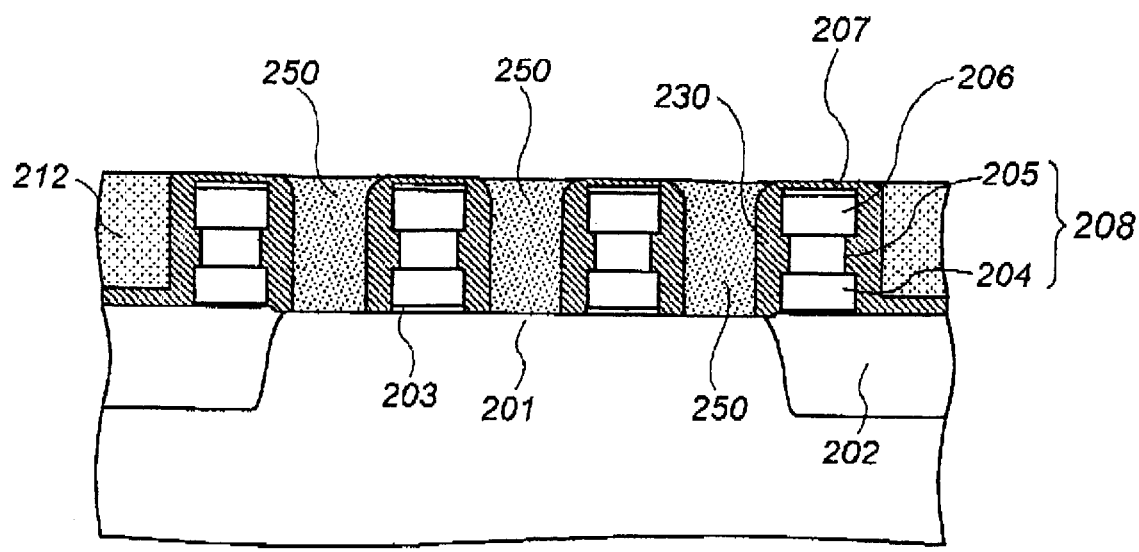

FIG. 11 is a schematic, cross-sectional view illustrating a step of separating the SAC pads in accordance with the present invention. Referring to FIG. 11, the SAC pads 250 are formed through an etch-back process or a CMP process.

In this case, the CMP process for etching the polysilicon layer 240 is kept to continue until the surface of the insulating layer on the gate structure is exposed and thereby the neighboring SAC pads are separated from each other.

The manufacturing method of SAC pad in accordance with the present invention can be applied to the manufacture of integrated circuits comprising a cell region, a core region, and/or peripheral region.

As a preferred embodiment of the present invention, a first insulating layer is deposited on the gate structures in the cell, core and peripheral regions. Thereafter, the first insulating layer is partially etched. Preferably, the first insulating layer can be a silicon nitride layer.

Now, a gate spacer is formed on the sidewalls of the gate structure in the core and peripheral regions by etching the first insulating layer deposited on the surface of the core and peripheral regions.

Subsequently, a second insulating layer is deposited on the whole wafer. Thereafter, the second insulating layer only in the cell region is eliminated for the formation of a gate spacer. Now, the exposed first insulating layer in the cell region is anisotropically etched to form a gate spacer in the cell region.

Although the invention has been illustrated and described with respect to exemplary embodiments thereof, it should be understood by those skilled in the art that various other changes, omissions and additions may be made therein and thereto, without departing from the spirit and scope of the present invention.

Therefore, the present invention should not be understood as limited to the specific embodiment set forth above but to include all possible embodiments which can be embodies within a scope encompassed and equivalents thereof with respect to the feature set forth in the appended claims.

What is claimed is:

1. A method of forming a semiconductor device on a substrate, comprising:

forming a plurality of gate structures on the substrate, the gate structures having a laterally recessed region on sidewalls of the plurality of gate structures;

conformally forming a first insulating layer over the gate structures, the first insulating layer having a laterally recessed region over the laterally recessed region of the gate structures;

flattening the first insulating layer over the laterally recessed region of the gate structures;

forming a second insulating layer over the flattened first insulating layer to fill spaces between the gate structures;

removing a portion of second insulating layer between the gate structures, thereby forming a plurality of contact holes between the gate structures and exposing a portion of the first insulating layer;

etching the exposed portion of the first insulating layer, thereby forming a gate spacer on sidewalls of the gate structures and exposing surfaces of active regions of the substrate;

filling the plurality of contact holes with a first conductive layer; and planarizing the first conductive layer, thereby forming contact pads.

2. The method as set forth in claim 1, wherein said gate structure comprises a conductive layer on which a gate capping layer is formed.

3. The method as set forth in claim 2, wherein the gate capping layer is formed of a material selected from the group consisting of silicon oxide, silicon nitride and combinations thereof.

4. The method as set forth in claim 1, wherein said step of forming the plurality of contact holes further comprises enlarging sizes of said plurality of contact holes by wet etch.

5. The method as set forth in claim 1, further comprising forming an ARC layer on the second insulating layer, and said step of etching the exposed first insulating layer includes a step of etching the ARC layer on the second insulating layer.

6. The method as set forth in claim 1, wherein said step of forming said second insulating layer further comprises a step of planarizing the second insulating layer.

7. The method as set forth in claim 6, wherein the thickness of the planarized second insulating layer is approximately 500~1000 Å.

8. The method as set forth in claim 1, wherein the second insulating layer is formed of a material selected from the group consisting of BPSG, USG, and HDP-CVD oxide.

9. The method as set forth in claim 8, wherein the thickness of the second insulating layer is approximately 3500~5500 Å.

10. The method as set forth in claim 1, wherein said step of forming said first insulating layer comprises a step of depositing a silicon nitride layer with a thickness of approximately 300~1000 Å.

11. The method as set forth in claim 1, wherein said step of forming the first insulating layer further comprises a step of partially etching the surface of said first insulating layer so that the surface of said first insulating layer on sidewalls of the gate structures is flat.

12. The method as set forth in claim 11, wherein the first insulating layer has a initial thickness and said step of partially etching the surface of the first insulating layer comprises a step of etching the first insulating layer to have a thickness of less than approximately two thirds of the initial thickness of the first insulating layer.

13. The method as set forth in claim 1, wherein said step of forming said plurality of contact holes comprises forming the plurality of contact holes using a mask pattern defining the plurality of contact holes having a T-shape, the contact holes exposing both a bit line contact and a storage node contact.

14. A method of manufacturing a semiconductor device on a substrate having a cell region, a core region and a peripheral region, comprising:

conformally forming a first insulating layer overlying gate structures on the substrate, the gate structures having a laterally recessed region on sidewalls of the plurality of gate structures;

flattening the first insulating layer overlying sidewalls of the gate structures;

forming a gate spacer on the sidewalls of the gate structures only in the core and peripheral regions by anisotropically etching the first insulating layer in the core and peripheral regions;

forming a second insulating layer over the first insulating layer;

removing the second insulating layer formed in the cell region and exposing a portion of the first insulating layer therein; and forming a gate spacer on sidewalls of the gate structures in the cell region by etching the exposed portion of the first insulating layer.

15. The method as set forth in claim 14, wherein said first insulating layer comprises a silicon nitride layer.

16. The method as set forth in claim 12, wherein said step of removing the second insulating layer further comprises wet etching.

17. A method of forming a semiconductor device on a substrate, comprising:

forming gate structures on the substrate, the gate structures having a laterally recessed region on sidewalls of the gate structures;

conformally forming a first insulating layer over the gate structures, the first insulating layer having a laterally recessed region over the laterally recessed region of the gate structures; and flattening the first insulating layer over the lateral recessed region of the gate structures.

18. The method of claim 17, further comprising:

anisotropically etching back the first insulating layer to form a spacer.

19. The method of claim 17, further comprising:

forming a second insulating layer over the flattened first insulating layer to fill spaces between the gate structures;

removing a portion of second insulating layer between the gate structures, thereby forming contact holes between the gate structures and exposing a portion of the first insulating layer;

etching the exposed portion of the first insulating layer, thereby forming a gate spacer on sidewalls of the gate structures and exposing surfaces of active regions of the substrate;

filling the plurality of contact holes with a first conductive layer; and planarizing the first conductive layer, thereby forming contact pads.

* * * * *

UNITED STATES PATENT AND TRADEMARK OFFICE
CERTIFICATE OF CORRECTION

PATENT NO. : 6,355,547 B1
DATED : March 12, 2002
INVENTOR(S) : Lee et al.

It is certified that error appears in the above-identified patent and that said Letters Patent is hereby corrected as shown below:

<u>Column 7,</u>
Lines 65-67, "The method as set forth in claim 1, wherein said step of forming the plurality of contact holes further comprises enlarging sizes of said plurality of contact holes by wet etch." should read -- The method as set forth in Claim 1, further comprising, after removing a portion of second insulating layer between the gate structures, wet etching said plurality of contact holes. --.

Signed and Sealed this

Fourteenth Day of September, 2004

JON W. DUDAS
*Director of the United States Patent and Trademark Office*